(12) United States Patent
Sakata

(10) Patent No.: US 7,319,337 B2
(45) Date of Patent: Jan. 15, 2008

(54) METHOD AND APPARATUS FOR PAD ALIGNED MULTIPROBE WAFER TESTING

(75) Inventor: Toru Sakata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/623,999

(22) Filed: Jan. 17, 2007

(65) Prior Publication Data

US 2007/0176612 A1    Aug. 2, 2007

Related U.S. Application Data

(62) Division of application No. 11/360,418, filed on Feb. 24, 2006, now Pat. No. 7,183,783.

(30) Foreign Application Priority Data

Feb. 25, 2005   (JP)   ............................. 2005-051442

(51) Int. Cl.
  *G01R 31/02*  (2006.01)
(52) U.S. Cl. ...................... 324/754; 324/757
(58) Field of Classification Search ................ None
  See application file for complete search history.

(56) References Cited

U.S. PATENT DOCUMENTS 5,521,522 A    5/1996   Abe et al.
5,525,912 A    6/1996   Momohara
7,026,833 B2*  4/2006   Rincon et al. ............... 324/754
7,218,128 B2*  5/2007   Atwood ...................... 324/758

FOREIGN PATENT DOCUMENTS

JP    60-117638    6/1985

* cited by examiner

*Primary Examiner*—Ha Tran Nguyen
*Assistant Examiner*—Trung Q. Nguyen
(74) *Attorney, Agent, or Firm*—Whitham Curtis Christofferson & Cook, P.C.

(57) ABSTRACT

A control unit of a wafer prober for implementing wafer examination, using a probe card including a multiple number of probes, executes a multiple number of measuring operations by bringing the probes of the probe card into contact with bonding pads formed on a wafer and by measuring the electric characteristics between predetermined pads of the bonding pads, each of the measuring operations being implemented after varying the relative position between the probe card and the wafer, in directions parallel to the face of the wafer. The control unit, upon execution of each of the measuring operations, implements the measuring operation after adjusting the relative position between the probe card and the wafer so that the contact position of each probe of the probes against each pad of the bonding pads is separated from all the positions at which the probes have already touched that pad of the bonding pads for a predetermined number of different times.

4 Claims, 3 Drawing Sheets

METHOD AND APPARATUS FOR PAD ALIGNED MULTIPROBE WAFER TESTING

CROSS-REFERENCE TO RELATED APPLICATIONS

This application is a divisional application of U.S. Ser. No. 11/360,418, filed Feb. 24, 2006 now U.S. Pat. No. 7,183,783, and the complete contents thereof is hereby incorporated by reference.

BACKGROUND OF THE INVENTION

1. Field of the Invention

The present invention relates to a wafer prober that automatically brings probes into contact with pads of multiple chips formed on a wafer and tests chip characteristics.

2. Description of the Related Art

Generally, in the semiconductor manufacturing process, devices and conductive patterns that constitute a plurality of chips 51 are formed on the surface of, typically disk-shaped, wafer 50 as shown in FIG. 1. Wafer 50 with devices and conductive patterns formed thereon is then diced along the predetermined scribe lines so as to produce individual, typically square-shaped, chips 51 to be the products. In this semiconductor manufacturing process, it has been known as a practice to measure the characteristics of chips 51 formed on wafer 50 before chips 51 are separated, by using a wafer prober so as to examine whether any defective chips 51 are present.

As a wafer prober, a configuration has been known which uses a probe card having a multiple number of probes formed in a predetermined planar pattern so that they will come into contact with a multiple number of bonding pads, typically made of aluminum and formed on chips 51. This wafer prober performs test of each chip 51 by precisely positioning its probe card relative to wafer 50 so that the probes come into contact with the bonding pads of each chip 51 at predetermined positions and by measuring electric characteristics between the bonding pads.

Thereafter, the wafer prober is moved relative to wafer 50 in order to examine different chips 51 on wafer 50 because the probe card is generally smaller than wafer 50. Thus, multiple shots for measurement are performed for single wafer 50. In this process, if the probes touch the same location on the same bonding pad several times due to multiple shots for measurement, there is a risk that the bonding pad might be badly scratched or might be peeled off in some cases, causing the problem that chip 51 cannot be correctly connected to the mounting substrate or the like.

To avoid this, in conventional wafer probers, a test is performed by varying the placement of the probe card relative to wafer 50 from one shot to another so that no probes will touch the same bonding pad. In other words, the placement of the probe card relative to wafer 50 at the time of each shot for measurement is performed in accordance with a placement pattern (a wafer shot pattern or a wafer shot map) in which the probe card is positioned relative to wafer 50 at the time of multiple shots for measurement, so that one area on the wafer covered by the probe card at the time of one shot does not overlap with another area covered thereby at the time of another shot. The square frame lines in FIG. 1 show one example of this wafer shot pattern. That is, each frame indicates the placement position of the probe card at the time of each measurement is taken.

In the example shown in FIG. 1, when the wafer probe is positioned over the area near the periphery of wafer 50, only a relatively low number of chips 51 can be examined by one shot for measurement. Moreover, in some cases depending on the sizes of wafer 50 and probe card 52, it could be necessary to perform one shot for measurement for a still lower number of chips 51. In this way, there are cases where examination throughput becomes inefficient due to low flexibility of the wafer shot pattern.

On the other hand, Japanese Patent Application Laid-open 60-117638 discloses a wafer manufacturing process in which a multiple number of functional tests are implemented under different conditions such as normal temperature, high temperature, low temperature and the like. In this case, in order to avoid an adverse effect due to contacts of the probe against the same location of any bonding pad, a multiple number of probe cards are used, which are differentiated from each other in a pattern of probes so that each pattern of probes comes into contact with bonding pads at different positions from those of another pattern.

SUMMARY OF THE INVENTION

The object of the present invention is to improve the efficiency of wafer examination by a probe card.

In order to achieve this object, a wafer prober according to the present invention comprises a probe card. The probe card has a multiple number of probes arranged in a predetermined pattern so as to be able to bring the probes into simultaneous contact with bonding pads of multiple semiconductor chips formed on a wafer. The wafer prober further comprises two means for changing the relative position between the probe card and the wafer, and a control unit. One of the means is to change the relative position between a position at which the probes touch the bonding pads and a position at which the probes are separated from the bonding pads. The other of the means is to change the relative position in directions parallel to the face of the wafer. The control unit controls the operations of the two means for changing the relative position between the probe card and the wafer so as to separate the probes of the probe card from the bonding pads, and to subsequently adjust the positional relation between the probe card and the wafer with respect to directions parallel to the face of said wafer, and to subsequently bring said probes of the probe card into contact with the predetermined pads of the bonding pads, and which implements a measuring operation for measuring the electric characteristics via the designated pads of the bonding pads. The control unit successively implements the measuring operations multiple times in accordance with a setup pattern, wherein the measuring operations are implemented under different conditions in which the relative position between the probe card and the wafer is varied in directions parallel to the face of the wafer. At this time, the control unit implements the measuring operations after adjusting the relative position between the probe card and the wafer upon execution of each of the measuring operations such that the contact position of each probe of the probes against each pad of the bonding pads is separated from all the positions at which the probes have already touched that pad of the bonding pads for a predetermined number of different times.

According to the present invention, even in a case where the wafer shot pattern is so set up that the same bonding pads are touched by probes several times during a multiple number of measuring operations and when the number of times the probes come into contact with the same bonding pad will exceed a predetermined number of times, the contact positions of probes against the bonding pads are automatically adjusted so that probes will not touch the same positions on the bonding pads for more than the predetermined number of different times. Thereby, if the probes touch the identical bonding pad at a greater number of different times than the predetermined number, it is possible to inhibit damage to the bonding pad that results from probes making contact with the pad. Accordingly, it is possible to improve the flexibility of the wafer shot pattern, and hence create an efficient examination by setting up an appropriate wafer shot pattern.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 2:
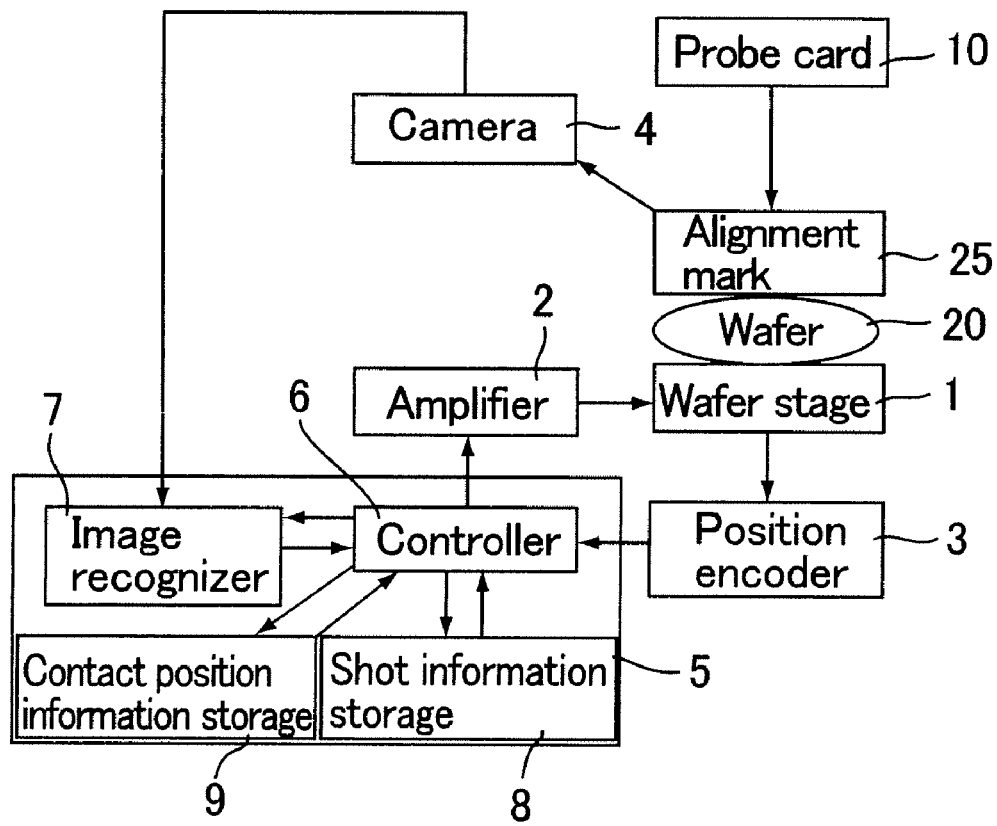
FIG. 2 is a block diagram showing a schematic configuration of a wafer prober of one embodiment of the present invention.

As shown in FIG. 2, the wafer prober of the present embodiment includes wafer stage 1 on which wafer 20 under test is mounted and probe card 10 supported at a predetermined position over wafer stage 1. This wafer prober also includes control unit 5 made up of a computer etc., for controlling the operation of each part based on a predetermined program.

Wafer stage 1 is precisely adjustable as to position by amplifier 2. The position of wafer stage 1 is detected by position encoder 3. Further, alignment mark 25 is previously formed at a predetermined position on wafer 20. The position of alignment mark 25 is detected by means of camera 4 and image recognizer 7. These detected signals are input to controller 6. Controller 6 can actuate amplifier 2 and adjust the position of wafer 20, supported on wafer stage 1, to a predetermined position based on these input signals.

Figure 3:
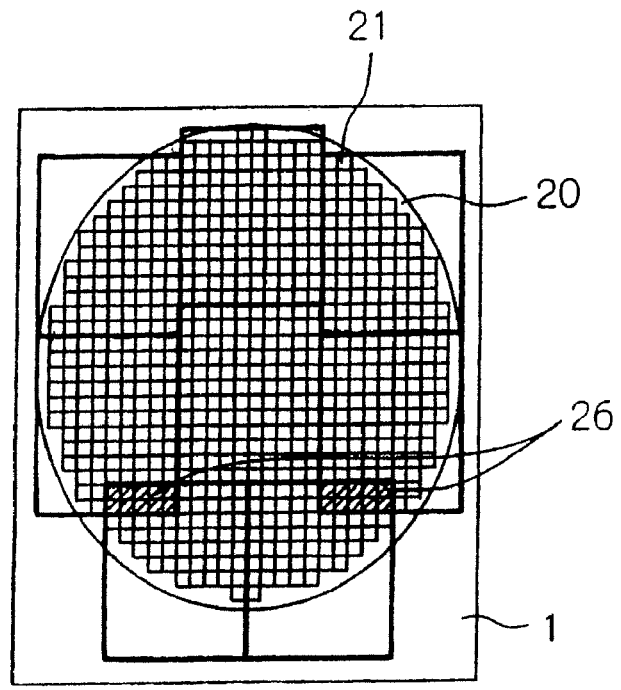
FIG. 3 is a plan view of a wafer which is examined by means of a wafer prober shown in FIG. 2, and also shows a pattern of placement of a probe card for different measurements.
Figure 4A:
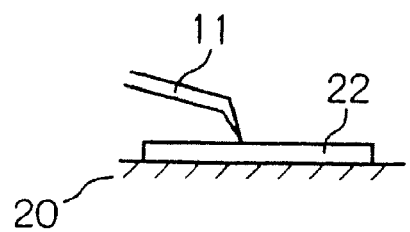
FIG. 4A is a side view showing a probe being brought into contact with a bonding pad formed on a wafer by means of a wafer prober shown in FIG. 2.
Figure 4B:
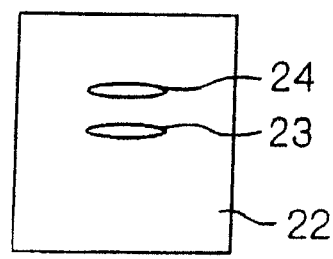
FIG. 4B is a plan view showing contact positions of probes.

As schematically shown in FIG. 3, a multiple number of chips 21 are formed on wafer 20. Each chip of chips 21 is formed with a predetermined pattern of bonding pads 22 (see FIGS. 4A and 4B) that can be electrically connected to the mounting substrate etc.

Probe card 5 has a planar size which is smaller than wafer 20 but can cover some chips of chips 21 formed on wafer 20.

Formed on the surface of probe card 10 facing wafer stage 1 are probes 11 (see FIGS. 4A and 4B) having a planar pattern corresponding to a predetermined pattern of bonding pads 22 on each chip of chips 21. That is, when probe card 10 and wafer stage 1 are put closer to each other while wafer 20 supported on wafer stage 1 is adjusted and kept to the predetermined position relative to probe card 10 in the directions parallel to the face of wafer 20, each probe of probes 11 comes into contact with each pad of bonding pads 22 at a predetermined position which is the approximate center of the individual pad of bonding pads 22, as indicated by reference numeral 23 of FIG. 4B, for example.

The relative position between probe card 10 and wafer 20 with respect to the directions parallel to the face of wafer 20 can be precisely adjusted by aforementioned wafer stage 1. It is also possible to adjust probe card 10 and wafer 20 between the position at which probes 11 of probe card 10 and bonding pads 22 on wafer 20 are put in contact and the position at which they are positioned away from each other, by movement of wafer stage 1. Alternatively, probe card 10 can be moved closer to or away from the surface of wafer stage 1 on which wafer 20 is supported, by means of an appropriate actuator.

Further, though not illustrated, the wafer prober includes a tester unit for measuring the electric characteristics via some probes of probes 11. Though not detailed, control unit 5 has the function of actuating this tester unit to measure the electric characteristics via previously determined probes of probes 11 of probe card 10, hence via predetermined pads of bonding pads 22 in each chip of chips 21. Further, control unit 5 can have the function of determining whether each chip of chips 21 is free from defects. Moreover, control unit 5 can have the function of adjusting the relative position between wafer 20 supported on wafer stage 1 and probe card 10 in accordance with a previously determined pattern of placement for different measurements, i.e., a wafer shot pattern, by actuation of amplifier 2 upon start of individual measurement, subsequently by measuring, and by performing these operations repeatedly so as to measure all the predetermined chips 21 on wafer 20. Further, control unit 5 can have the function of determining pass/failure during the above operations.

Next, one example of wafer examination by the wafer prober of this embodiment will be described.

As stated above, the wafer prober performs a series of multiple shots for measurement while sequentially moving wafer stage 1 in accordance with a previously determined wafer shot pattern. FIG. 3 shows the areas with reference to wafer 20, which are covered by probe card 10 when individual shots for measurement take place, with square frame lines.

The shots for measurement are sequentially performed from the area enclosed by the upper left frame line in FIG. 3 to the adjacent areas, for example. At this time, each of the six framed areas located on the upper side in FIG. 3, which are covered by probe card 10 over wafer 20 when each measurement takes place, is allocated so as not to overlap the others.

On the other hand, the two framed areas located on the lower side in FIG. 3, which are covered by probe card 10 over wafer 20 when each measurement takes place, overlap the framed areas located above those two framed areas, at the sections designated by reference numeral 26. Therefore, probes 11 will touch the pads of bonding pads 22 twice, which are the pads belonging to the chips of chips 21 that are located within the sections designated by reference numeral 26.

In this case, when the wafer prober of the present embodiment implements measurement at the positions indicated by two frame lines located at the bottom in FIG. 3, the wafer prober will appropriately adjust the position of probe card 10 relative to wafer 20 so that each of probes 11 will touch the corresponding pads of bonding pads 22 at a position marginally away from the position at which the previous touch was made. More specifically, for example, upon the measurement at the positions indicated by the six upper frame lines in FIG. 3, each of probes 11 is brought into contact with the central portion of bonding pads 22, as indicated by reference numeral 23 of FIG. 4B. In contrast, upon the measurement at the positions indicated by the two lower frame lines in FIG. 3, probes 11 are brought into contact with a position marginally shifted above, in FIG. 4B, from the center of bonding pads 22, designated by reference numeral 24 in FIG. 4B.

Figure 1:
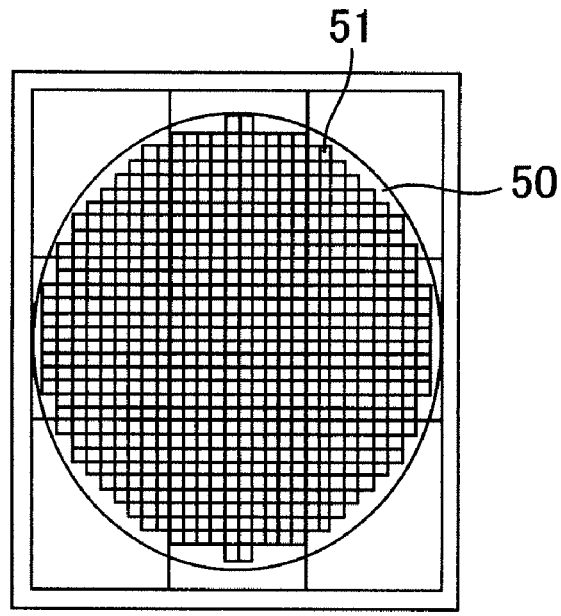
FIG. 1 is a plan view of a wafer which is examined by means of a wafer prober, and also shows a pattern of placement of a probe card, which determines the movement of the prove card, of a conventional wafer prober for different measurements.

In this way, when probes 11 are brought into contact with the same pad of bonding pads 22, it is possible to inhibit enlargement of the damage on that pad of bonding pads 22, that results from probes 11 touching that pad of bonding pads 22, and it is also possible to prevent a large part of that pad of bonding pads 22 from peeling off. Accordingly, in accordance with the present embodiment, it is possible to choose a wafer shot pattern in a manner that allows the areas, which are covered by prove card 10 over wafer 20 when multiple shots for measurement take place, to overlap one another without any damage of bonding pads 22 of chips 21, hence it is possible to improve flexibility of the wafer shot pattern. As a result, the operator of the wafer prober is able to set up an appropriate wafer shot pattern in accordance with the sizes of wafer 20 and probe card 10 and the like, such that examination efficiency is improved. In contrast to the conventional example shown in FIG. 1 where nine shots for measurement are needed, eight shots for measurement are enough to perform examination of similar wafer 20 in the example shown in FIG. 3. In this way, efficiency of examination throughput is improved.

Although the above testing process was described taking an example where identical bonding pads 22 in the areas designated by numeral 26 are touched twice by probes 11, it is also possible to allow the operator to set up a pattern of placement of probe card 10 in which some identical pads of bonding pads 22 are touched by probes 11 at three or more different times. In this case, it is possible to shift the contact positions of some probes of probes 11 to the same pads of bonding pads 22 at three or more different times, so that all the contact positions are different from each other.

Next, description will be made of a more specific configuration of control unit 5 that performs shifting control of the contact positions of probes 11 to bonding pads 22 among multiple shots for measurement during which some pads of bonding pads 22 are brought into contact with probes 11 at a multiple number of different times as in the above case.

In the configuration of the present embodiment shown in FIG. 2, control unit 5 has shot information storage 8 and contact position information storage 9. Controller 6 stores information of the positions of the chips of chips 21 on wafer 20, which undergo the characteristic measurement, that is, which are touched with probes 11 of probe card 10 for the characteristic measurement, into shot information storage 8 when a shot for characteristic measurement is made. At the same time, controller 6 also stores information of the position, at which each probe of probes 11 touches each pad of bonding pads 22, in contact position information storage 9, while linking this information with the information in shot information storage 8. For this purpose, the information of the contact position may be stored, for example, in the form of a combination of an offset direction and an offset distance from a standard position, the standard position being set at a central position of bonding pads 22.

After taking shots for measurement, controller 6 moves wafer stage 1 to the position for taking the next shot for measurement in accordance with the wafer shot pattern. At this time, information from shot information storage 8 is read out and it is judged whether the chips of chips 21 to be measured at the next measurement position include the chips of chips 21 that have already been measured during the previous shot for measurement. From this, if any chips of chips 21 that have already been measured during the previous shot for measurement are included in the chips of chips 21 to be measured next, the information of the positions of individual bonding pads 22 where probes 11 touched during the previous shot for measurement is read out and an offset direction and offset distance that can avoid contact at the same positions, are selected For example, the way of this selection can be previously determined as follows: the offset is set at 0 if chips that have been touched by probes 11 up to this point are not included in the chips to be measured; the offset direction is set to be upward if only the chips of chips 21 that have been touched once by probes 11 are included in the chips of chips 21 to be measured next; the offset direction is set to be downward if the chips of chips 21 that have been touched twice by probes 11 are included; the offset direction is set to be rightward if the chips of chips 21 that have been touched at three different times by probes 11 are included. Alternatively, it is also possible to select an offset direction and offset distance in a random fashion, from among alternatives, in which probes 11 will not touch the same position of bonding pads 22, and which are included in multiple predetermined alternatives in which the offset direction and distance have been set.

Controller 6 then computes the shift position of wafer stage 1 taking into account the selected offset direction and offset distance and moves wafer stage 1. That is, the position at which the next shot for measurement is implemented by probe card 10 is selected at the position that deviates in the selected offset direction by the selected offset distance from the standard position that is determined in accordance with the wafer shot map.

In accordance with this configuration, it is possible for the operator of the wafer prober to implement examination so that bonding pads 22 are not damaged due to repeated contacts of probes 11, by performing a relatively easy setup of a wafer shot map, that is, by making a rough setup for determining the standard positions of individual shots for measurement (e.g., setting up the areas of chips 21 which should be touched by probes 11 at the time of individual shots for measurement). In other words, the operator can freely set up a shot map, and then controller 6 automatically avoids multiple contacts of probes 11 on the same position on each pad of bonding pads 22. Accordingly, it is no longer necessary for the operator to set up a wafer shot map by taking into account whether bonding pads 22 of chips 21 will be touched at a multiple number of different times by probes 11 or to set up how to avoid bonding pads 22 being touched at the same positions by probes 11 when the same chips are touched at a multiple number of different times.

Figure 5:
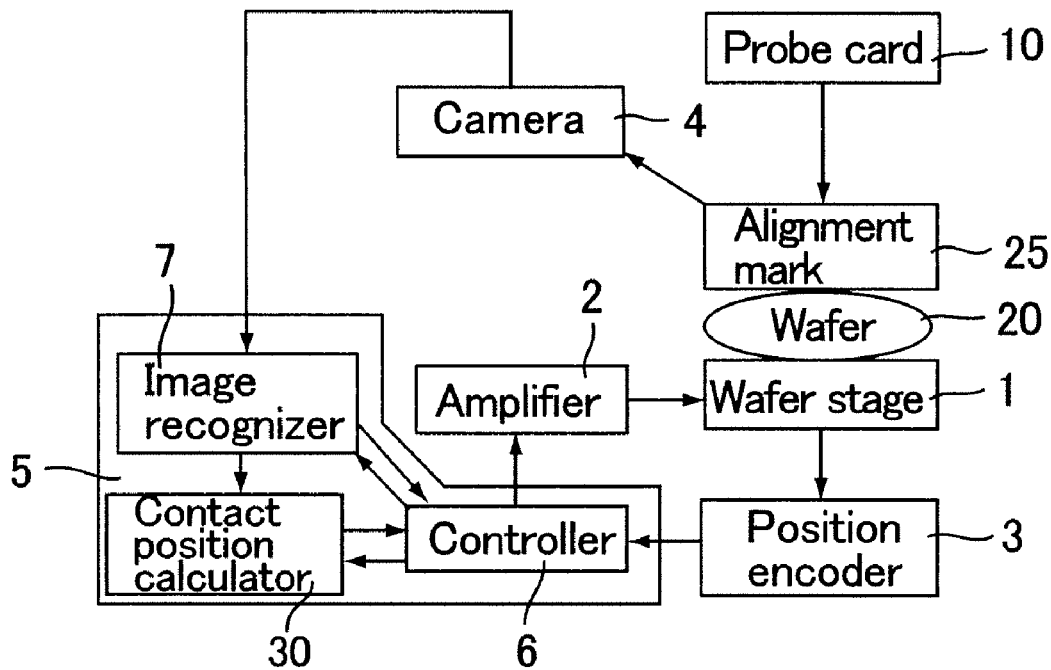
FIG. 5 is a block diagram showing a schematic configuration of a wafer prober of an alternative example of FIG. 2.

Next, another configurational example of control unit 5 is shown in FIG. 5.

In the example shown in FIG. 5, control unit 5 has contact position calculator 30 for calculating the positions of probe needle scars formed on bonding pads 22 by contact with probes 11 based on the image signal input from camera 4 via image recognizer 7. Upon execution of each shot for measurement, contact position calculator 30 judges whether any probe needle scar has been formed on each pad of bonding pads 22, which probes 11 of probe card 20 will touch at the time of the next shot, and calculates the position at which the probe needle scar is formed on each pad of bonding pads 22.

If any probe needle scars are found on the pads of bonding pads 22 which probes 11 of probe card 10 will touch at the time of the next shot for measurement based on the input from contact position calculator 30, controller 6 moves wafer stage 1 to a position that deviates from the standard position for each pad of bonding pads 22 so that probes 11 will come into contact with positions that deviates from the probe needle scars and controller 6 implements measurement. The position shifting operation at this time can be made similarly to the case of the configuration shown in FIG. 2, based on, for example, the predetermined alternatives in which the offset direction and offset distance is set.

Figure 6:
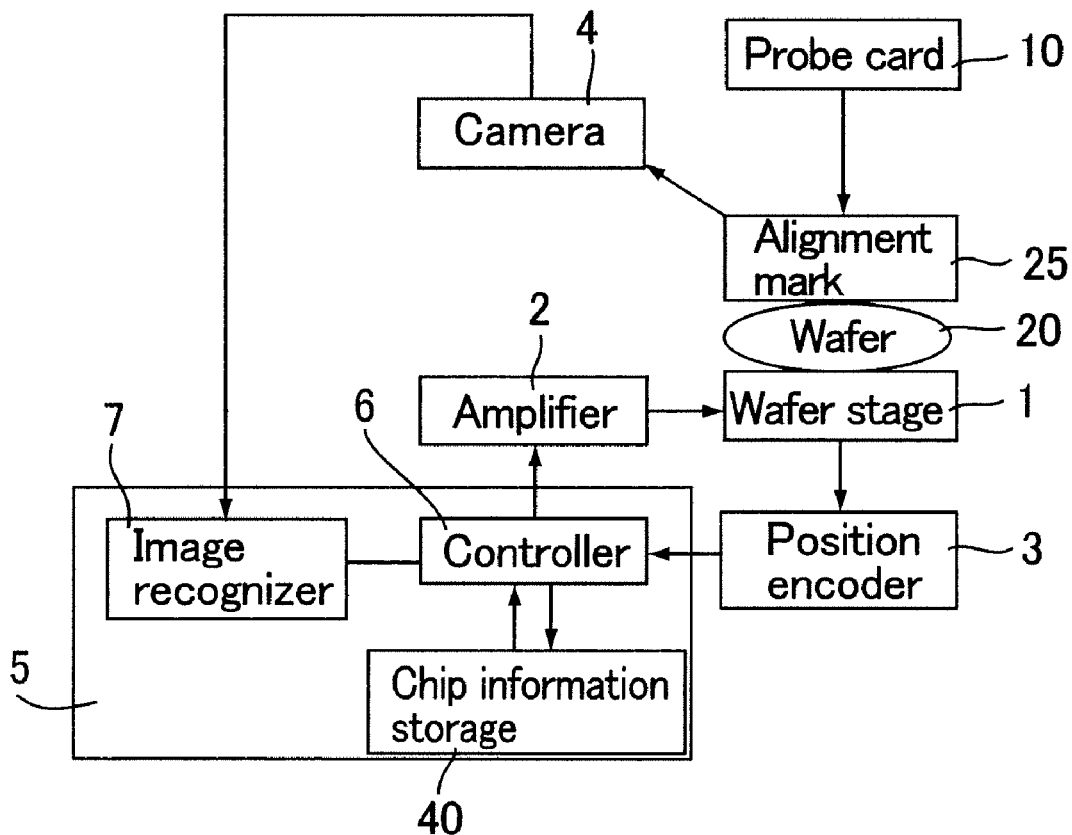
FIG. 6 is a block diagram showing a schematic configuration of a wafer prober of another alternative example of FIG. 2.

Next, still another configurational example of control unit 5 is shown in FIG. 6.

In the configuration shown in FIG. 6, control unit 5 has chip information storage 40 for storing information of the number of times each chip of chips 21 on wafer 20 is touched by probes 11. In this configuration, upon execution of each shot for measurement, controller 6 reads out the number of times that chips 21 have been touched by probes 11 for all the chips of chips 21 that will be touched by probes 11 of probe card 10 during the next shot. Controller 6 then selects the position on bonding pads 22, at which probes 11 will be brought into contact for the next shot, based on the greatest number of times that the chips of chips 21, which will be touched by probes 11 during the next measurement, have been touched by probes 11 of probe card 10. For example, it is possible to set up beforehand the positions of contact that vary depending on the number of contacts that have been made before measurement, such that contact will made at the center of bonding pads 22 when no contact has been made during the previous shot, and contact will be made at a position that is shifted upwards by a predetermined offset distance from the center when one contact has been made, and so on.

After the shot for measurement, for all the chips of chips 21 that have been touched by probes 11 during that measurement, information about the number of contacts stored in chip information storage 40 is rewritten by the addition of one to the greatest number of times that any of the chips, which were touched by probes 11 during that measurement, has been touched during the previous measurement. With this configuration, it is possible to avoid having probes 11 touch the same position of the same pads of bonding pads 22 at a multiple number of different times.

The embodiments and alternative examples described heretofore are mere examples of the present invention, and various modifications can be added within the scope of the invention. For example, although the above example was described by referring to a configuration in which probes 11 are prevented from touching the same positions of the same pad of bonding pads 22, it is possible to provide a configuration, for example, in which probes are permitted to touch the same position twice, whereas making contact three or more times will be prevented. Alternatively, it is possible to provide a configuration in which, if a probe needle scar, based on the image of the probe needle scar formed on bonding pads 22, that is greater than the predetermined size is found on a pad of bonding pads 22, contact of probes 11 against that pad of bonding pads 22 at that position will be avoided.

What is claimed is:

1. A wafer prober for testing a plurality of semiconductor chips formed on a wafer, each chip having a plurality of bonding pads, each pad having a pad contact area, comprising:
   a probe card having at least two probes arranged such that said probes can simultaneously contact a respective at least two of said bonding pads;
   a first positioning means for changing, in response to a control signal, a relative position between said probe card and said wafer in directions normal to a face of said wafer, between a position at which said probes touch said bonding pads and a position at which said probes are separated from said bonding pads;
   a second positioning means for changing, in response to a control signal, the relative position between said probe card and said wafer, in directions parallel to said face;
   a means for determining, using a captured image of said wafer, a position of a probe needle scar formed on said bonding pads through contact of said at least two probes against said bonding pads; and
   a control unit having means for measuring electrical characteristics between pads contacted by said probes, and for generating a sequence of said control signal such that said first positioning means, said second positioning means for measuring carry out a succession of measurement cycles, and wherein said control unit identifies, from said means for determining, if a pad has been contacted by one of said at least two probes,
   wherein at least one of said measurement cycles comprises said first positioning separating said at least two probes of said probe card from said bonding pads,
   said second positioning means subsequently changing a positional relation between said probe card and said wafer to a position wherein at least one of said at least two probes is aligned above a contact location within the contact area of a target pad of said bonding pads, wherein said contact location is based on a starting predetermined standard location and an offset, wherein said offset is based, at least in part, on whether or not said means for determining identifies that said target pad has been previously contacted by any of said probes,
   said first positioning means subsequently bringing said at least two of said probes of said probe card into contact with said at least two predetermined pads of said bonding pads, including said at least one of said probes contacting said target pad at said contact location,
   said measuring means measuring electrical characteristics between designated pads of said bonding pads; and
   wherein said measuring means successively implements measuring operations multiple times in accordance with a setup pattern, the measuring operations being implemented under different conditions in which relative position between said probe card and said wafer is varied in directions parallel to a face of said wafer.

2. The wafer prober of claim 1, wherein said control unit generates said control signal such that the second positioning means adjusts the relative position between said probe card and said wafer with the offset being such so that a pad of said bonding pads is touched at least times by said probes and, for each of said at least two times, is touched at a different point of the contact area of the pad.

3. The wafer prober of claim 1 wherein said control unit stores into a storage unit information about the location, within the contact area of at least one of said bonding pads, where that pad has been contacted by said probes, and
 wherein said control means reads said information from said storage and generates said sequence of said control signal based on said information such that the offset controls said second positioning means to adjust the relative position between said probe card and said wafer so that each probe of said probes comes into contact with each pad of said bonding pads at a position within the pad's contact area separated from all the positions at which said probes have already touched that pad of said bonding pads.

4. The wafer prober of claim 1, wherein said control unit generates the control signal such that, for at least one pad, the probe contacts a first position within the contact area of a pad at least two times and contacts a second position within said contact area of said pad at least once, said second position being offset, in a direction parallel to the face of the wafer, from said first position.

* * * * *